United States Patent [19]

Meyers

[11] Patent Number: 5,412,325
[45] Date of Patent: May 2, 1995

[54] PHASE NOISE MEASUREMENT SYSTEM AND METHOD

[75] Inventor: Clifford W. Meyers, Rancho Palos Verdes, Calif.

[73] Assignee: Hughes Aircraft Company, Los Angeles, Calif.

[21] Appl. No.: 173,534

[22] Filed: Dec. 23, 1993

[51] Int. Cl.⁶ .......................................... G01R 27/00
[52] U.S. Cl. ................... 324/613; 455/67.3; 364/728.03
[58] Field of Search .............. 455/67.3, 67.6, 63; 324/613; 364/728.03

[56] References Cited

U.S. PATENT DOCUMENTS

| | | | |
|---|---|---|---|
| 4,748,399 | 5/1988 | Caldwell | 324/613 |
| 5,053,714 | 10/1991 | Durand | 324/613 |
| 5,172,064 | 12/1992 | Walls | 324/613 |
| 5,179,344 | 1/1993 | Najle | 324/613 |
| 5,180,985 | 1/1993 | Zoccarato | 324/613 |

*Primary Examiner*—Kenneth A. Wieder
*Assistant Examiner*—Jose M. Solis
*Attorney, Agent, or Firm*—Leonard A. Alkov; Wanda K. Denson-Low

[57] ABSTRACT

Three independent signal sources are used to statistically derive the power spectral density of the phase noise content of signals from each of them. This is accomplished by mixing each of the signals two at a time (i.e., signal one with signal two, signal one with signal three, and signal two with signal three) and capturing the resultant difference signals, such as with a waveform recorder, for example. A servo electronics loop is used to remove the carrier and any long term signal drift from the resultant difference signals. Statistical analysis is then used to compute the composite power spectral densities of the the resultant difference signals, and to solve for the individual power spectral densities of the original signals. The present system and method uses the mathematical relationships between the three sources that have similar magnitudes of phase noise, to compute the power spectral density of the noise content of signals from each source. The present system and method requires a minimum of interconnect hardware and only three inexpensive waveform recorders. Furthermore, the size, weight, and cost of producing the present phase noise test system is relatively low.

6 Claims, 2 Drawing Sheets

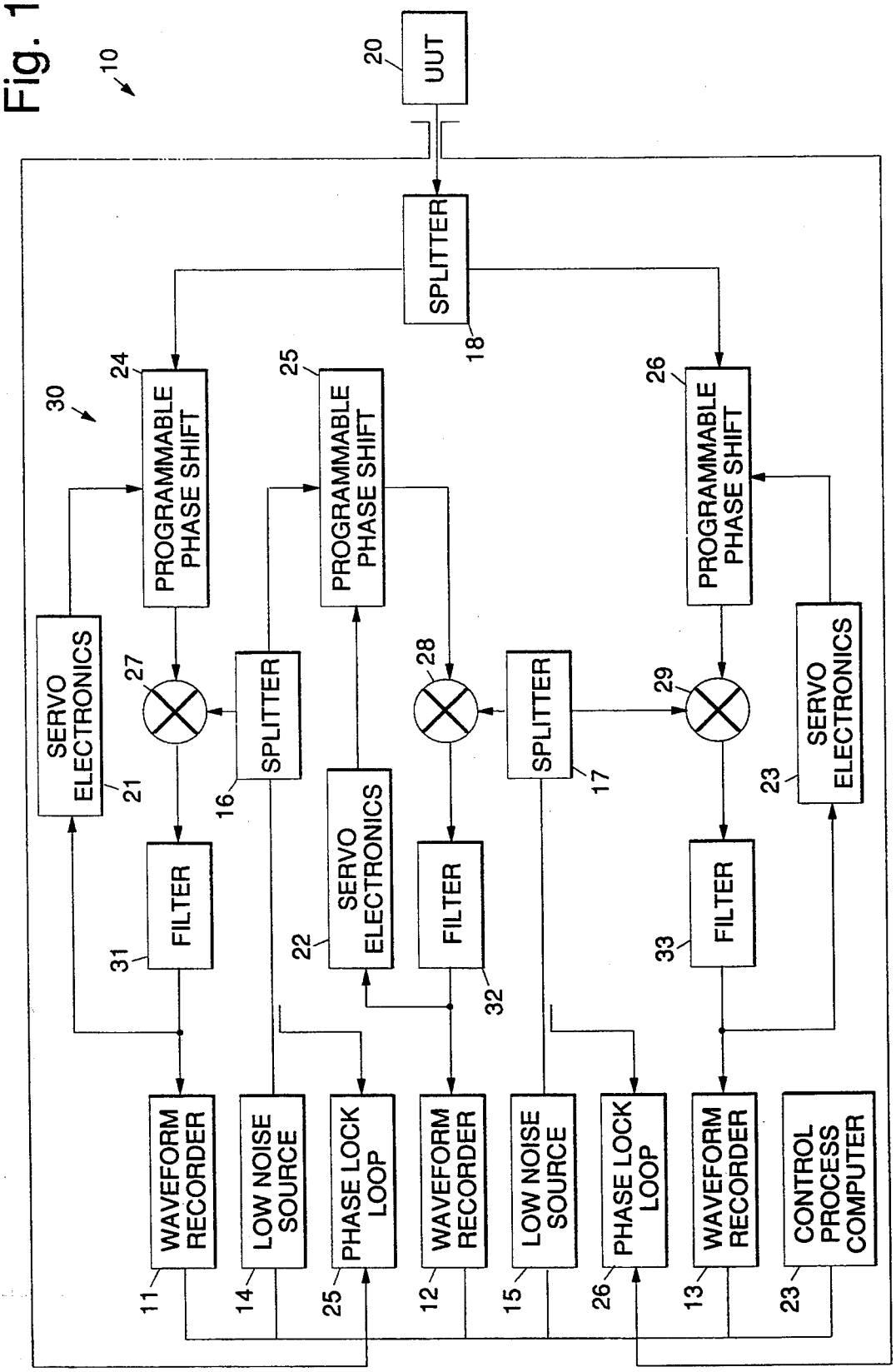

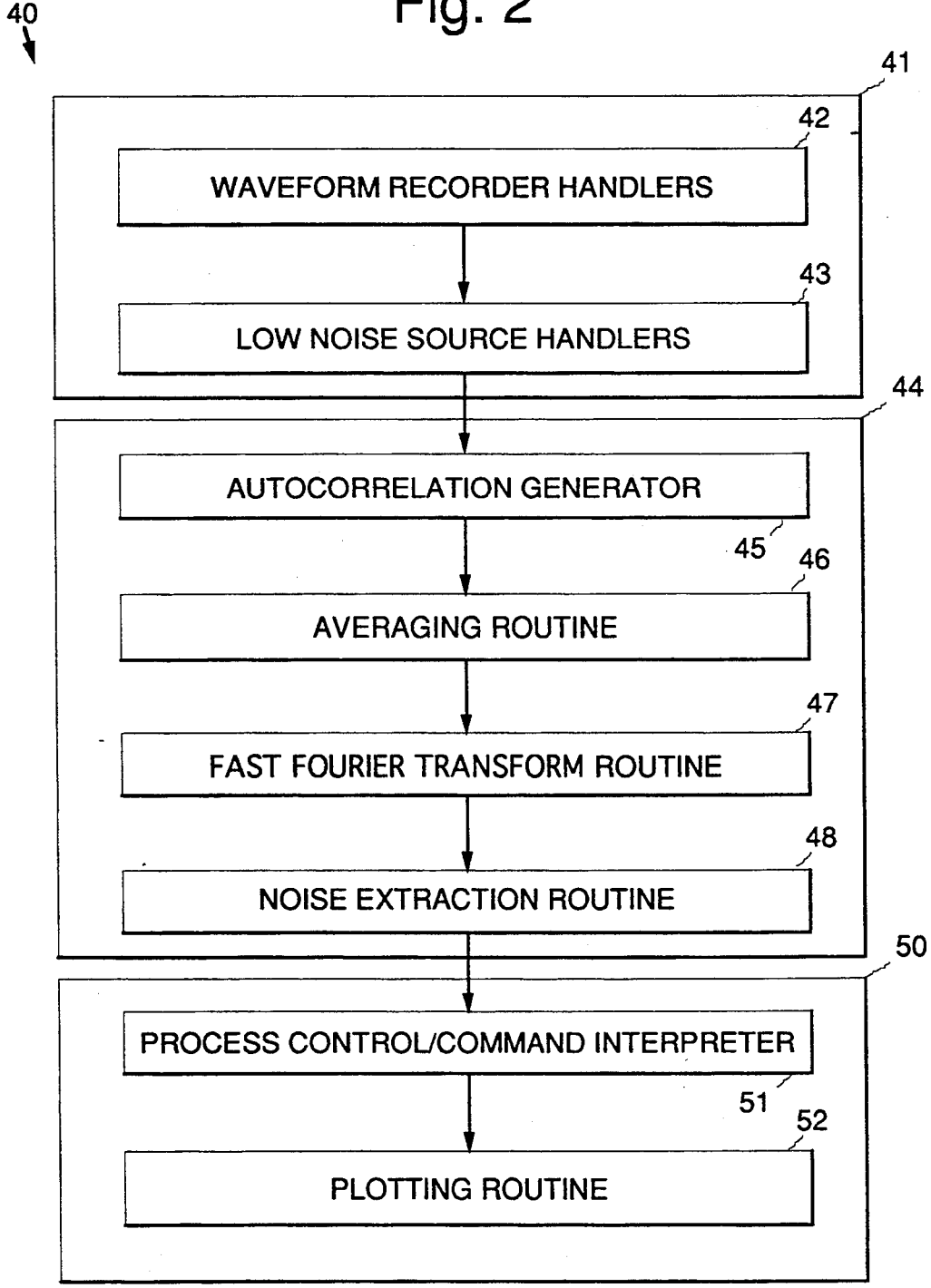

PHASE NOISE MEASUREMENT SYSTEM AND METHOD

BACKGROUND

The present invention relates generally to phase noise measurement systems, and more particularly, to a phase noise measurement system that uses three independent signal sources to statistically derive the power spectral density of the phase noise content of each of them.

Typical phase noise measurement test sets available in the commercial market fall into two primary categories: a two oscillator systems (or phase detector system) and a delay line discriminator system. To clarify these systems, each is discussed separately. The two oscillator system uses two sources (a unit under test and a reference source) that are set to the same frequency and that are in quadrature with respect to each other. These signals are input to a double balanced mixer that is used as a phase detector, and the resultant output is passed through a low pass filter. The remaining signal is a low voltage DC signal that is summed with an AC signal. The AC fluctuations are proportional to the combined phase noise of the original two signal sources. This AC signal is then fed into a spectrum analyzer and the power spectrum is displayed to a user. The primary limiting factor of this approach is the requirement that the reference source have phase noise characteristics that are at least 10 dB better than the source that is measured. In the case of phase noise measurements for radar signal sources, these sources have very low phase noise, and finding a reference that is superior can be very difficult or impossible. Therefore, this method is primarily used for measuring signal sources of higher noise content or for measuring phase noise close to the carrier.

The delay line discriminator system does not require additional reference sources. It uses the signal from the unit under test and splits it into two signals. The signal in one pats is input into a delay line whose output feeds a phase detector. The other signal is fed directly to the phase detector. Phase detecting the delayed and non-delayed signals together creates a discrimination effect which produces a frequency modulated signal proportional to the signal's inherent noise content. This FM noise signal is then inteegrated and measured by a baseband spectrum analyzer. This system has several limitations. Its sensitivity is proportional to the delay time and the larger the delay time the greater the insertion loss. This acts as a practical limitation for the sensitivity of the system. Furthermore, the sensitivity degrades as $1/f^2$ as the carrier is approached. Therefore, this technique is not useful measuring very stable sources close to the carrier frequency.

Accordingly, it is an objective of the present invention to provide for an improved phase noise measurement system that overcomes the limitations of conventional systems.

SUMMARY OF THE INVENTION

The present system and method is used to determine the phase noise of a primary signal source. The present system uses three independent signal sources to statistically derive the power spectral density of the phase noise content of signals from each of them. This is accomplished by mixing each of the signals two at a time (i.e., signal one with signal two, signal one with signal three, and signal two with signal three) and measuring the resultant difference signals, such as with a waveform recorder. A servo electronics subsystem is used to remove the residual low frequency products and any long term signal drift from the difference signals, and the difference signals are then captured via three channels of waveform recorders. Statistical analysis routines are then used to compute the composite power spectral densities of the difference signals, and to ultimately solve for the individual power spectral densities of the original signals. Thus, the phase noise of the primary signal source is determined.

More particularly, the present invention comprises a phase noise measurement system that includes a primary signal source for providing a first signal whose phase noise is to be measured, and second and third signal sources (for providing second and third signals that each have substantially the same frequency and a similar noise content as first signal provided by the primary signal source). Mixing means are coupled to the three signal sources for mixing each of the first, second, and third signals two at a time to generate three respective difference signals. Servo electronics are coupled to the mixing means for sensing residual low frequency carrier artifacts and long term carrier drift and removing them. Waveform recorder means are coupled to the mixing means for capturing the respective magnitudes of the three difference signals. Processing means are coupled to the waveform recorder means for processing the three difference signals to statistically analyze them to compute composite power spectral densities therefor, and for computing respective individual power spectral densities of the first, second and third signals from the composite power spectral densities, and hence determining the phase noise of the primary signal source.

The present invention also provides for method of determining the phase noise of signals from a primary signal source. The method comprises the following steps. Providing a first signal from a primary signal source whose phase noise is to be measured. Providing second and third signals from second and third signal sources that each have substantially the same frequency and a similar noise content as first signal provided by the primary signal source. Mixing each of the first, second, and third signals two at a time to generate three respective difference signals. Applying a servo loop to the three mixer circuits to remove residual carrier signals and long term signal drift therefrom. Capturing the three respective difference signals. Statistically analyzing the three difference signals to compute composite power spectral densities therefor. Computing respective individual power spectral densities of the first, second and third signals from the composite power spectral densities to determine the phase noise of the primary signal source.

The present system and method thus uses mathematical relationships between three signal sources, with similar magnitudes of phase noise, to compute the power spectral density of the noise content of each source. Where traditional techniques typically require ultrastable reference sources or expensive calibrated delay lines, the present system requires a minimum of interconnect hardware and only three inexpensive waveform recorder channels, for example. Furthermore, the size, weight, and cost of producing the present phase noise test system is substantially lower than present commercially available units.

Traditional phase noise measurement techniques typically address two problem areas: phase noise close to the carrier and phase noise far from the carrier. Furthermore, because these problems are diverse, it takes one commercial test set to address each area. However, the present technique addresses the entire problem with one system configuration. This has not been done by any commercial system vendor, and is therefore heretofore unavailable.

Future factory and field testers are expected to be down-sized for greater portability and lower cost. The present system relies on virtual instrument concepts to achieve this goal. Virtual instruments are presently unavailable in the commercial market place. The present system is adapted to replace existing phase noise measurement systems currently used for near-in and far-from the carrier phase measurements. There is also a need for a system to test devices such as crystal oscillators, synthesizers, atomic clocks and standards, and low noise and ultra-low noise sources. The present system makes these tests more affordable while requiring less space.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 is a system block diagram of a phase noise measurement system in accordance with the principles of the present invention; and FIG. 2 shows a software flow diagram employed in the phase noise measurement system of FIG. 1.

DETAILED DESCRIPTION

Referring to the drawing figures, FIG. 1 is a system block diagram of a phase noise measurement system in accordance with the principles of the present invention the phase noise measurement system is comprised of two low noise reference sources 14, 15 that are both programmable and phase lockable. These reference sources 14, 15 are used in conjunction with a unit under test (UUT) 20 that comprises a third source. The reference sources 14, 15 are phase locked to the unit under test 20 by means of first and second phase locked loops 25, 26. The phase locked loops 25, 26 are adapted to minimize cancellation of phase noise that is close to the carrier.

Outputs from the three sources (the two reference sources 14, 15 and the UUT 20) are applied to three splitters 16, 17, 18. The outputs from the splitters 16, 17, 18 are fed both to three mixers 27, 28, 29 and to three programmable phase shifters 24, 25, 26. This produces three sets of signals at the mixers 27, 28, 29 that are in quadrature. However, if the outputs of the mixers 27, 28, 29 produce a resultant signal with a residual carrier, servo electronics units 21, 22, 23 sweep the phase shifters 24, 25, 26 to produce a signal with a 0 Hz carrier (null carrier). The outputs of the three mixers 27, 28, 29 are fed into their respective low pass filters 31, 32, 33. These filters 31, 32, 33 reject high frequency mixer products and also limit the noise bandwidth, in that they act as an anti-aliasing filter. The outputs of the filters 31, 32, 33 are applied to three waveform recorders 11, 12, 13. The waveform recorders 11, 12, 13 digitize the noise signals and couple them to a control/process computer 23 for analysis.

FIG. 2 is a block diagram of software 40 employed in the control/process computer 23 of the phase noise measurement system 10. The software 40 is comprised of eight functional software routines that process the measured data and produce the desired spectral results. The first major section of the software 40 comprises a data acquisition module 41. The data acquisition module 41 provides for hardware control of the components of the system 10 and is comprised of two instrument handlers, a waveform recorder handler 42 for the waveform recorders 11, 12, 13 and a low noise source handler 43 for the low noise sources 14, 15, 16. The functions of these handlers 42, 43 include setup of the waveform recorders 11, 12, 13 and low noise sources 14, 15, 16, and programming of the phase shifters 24, 25, 26.

Once the data is digitized and acquired by the data acquisition module 41, control is passed to a phase analysis engine module 44. In the phase analysis engine module 44, the mixed phase noise data is analyzed using digital signal processing techniques, including an autocorrelation generator routine 45, averaging routine 46, noise extraction routine 48, and a fast Fourier transform routine 47. The autocorrelation generator routine 45 generates autocorrelation functions for the three mixed and downconverted noise signals (R13, R23, R12). To minimize the random variance and quantization noise introduced into the calculations, the autocorrelation functions for the combined noise signals (R13, R23, R12) are averaged using the averaging routine 46. The averaging function involves acquiring multiple signal sets and computing a series of autocorrelation functions for the combined noise (R13, R23, R12). Then each autocorrelation function (i.e., R13) is averaged over the series. Following the averaging calculations for the combined noise, the autocorrelation functions (R13, R23, R12) are converted to power spectral density functions (P13, P23, P13) using the fast Fourier transformation routine 47. The conversion from autocorrelation functions to power spectral density functions is based on the Wiener-Khinchin theorem. At this point, the individual noise power spectral densities (P1, P2, P3) are then computed using the noise extraction routine 48. The power spectral densities (P1, P2, P3) are then formatted and passed to a human interface module 50. The human interface module 50 handles keyboard interactions, displaying functions, command interpretations, plotting functions and calculations and the overall process flow of the software 40. This is accomplished using a process control/command interpreter routine 51 and a plotting routine 52.

The phase noise measurement system 10 is adapted to measure phase noise in active devices comprising the unit under test 20 by using sophisticated digital processing techniques. The novelty of this system 10 lies in the way the noise signal is handled and analyzed and the use of autocorrelation functions and spectral power density functions in the final analysis routines 45–48 of the phase analysis engine module 44. The value of this technique lies in the fundamental trade-off between hardware and software, i.e. if hardware may be eliminated by using software analysis, it lowers the cost of the measurement system 10. Furthermore, reducing the hardware results in a lighter, smaller, and more reliable product. The present system 10 provides a means for addressing factory and bench testing applications and field testing applications requiring reduced weight, size, and cost.

The present measurement system 10 trades hardware complexity for software sophistication. It uses the mathematical relationships between discrete time measurements, autocorrelation functions, power spectral density conversions, and error minimization theory to extract the noise content from a signal derived from the unit under test 20. To help clarify the principles and theory behind the present invention, a general mathematical description is presented below.

To measure the noise content of the signal from the unit under test 20 using the present system 10 requires the two additional reference sources 14, 15 having substantially the same frequency and similar noise content. That is, all three sources 14, 15, 20, have the same carrier frequency and have noise spectra within 10 dB of each other. Let $\phi_1(t)$, $\phi_2(t)$ and $\phi_3(t)$ represent the phase noise content of each of the three signal sources 14, 15, 20 and assume that all three sources 14, 15, 20 have carriers in the RF/microwave region. The three signals produced by the three signal sources 14, 15, 20 are given by:

$$V_1(t) = \sin(W_c t + \phi_1(t))$$

$$V_2(t) = \sin(W_c t + \phi_2(t))$$

$$V_3(t) = \sin(W_c t + \phi_3(t))$$

The next step is to mix the three signals together, two at a time, to create three new composite baseband signals. Assume that the mixing is performed with the signals in quadrature and the results are passed through low pass filters 31, 32, 33 each having a gain of two. The three sets of signals produced by the three signal sources 14, 15, 20 are given by:

$$V_{13}(t) = V_1(t) \times V_3(t) \times 2$$

$$V_{12}(t) = V_1(t) \times V_2(t) \times 2$$

$$V_{23}(t) = V_2(t) \times V_3(t) \times 2.$$

Then, after filtering:

$$V_{13}(t) = \sin(\phi_1(t) - \phi_3(t))$$

$$V_{12}(t) = \sin(\phi_1(t) - \phi_2(t))$$

$$V_{23}(t) = \sin(\phi_2(t) - \phi_3(t)),$$

which correspond to the outputs of the three mixers 27, 28, 29. The composite noise signals (i.e.: $\phi_1(t) - \phi_3(t)$) represent very small angles ($<<.1$ radians). Therefore, the following simplification is made to produce the outputs of the filters 31, 32, 33:

$$V_{13}(t) \approx [\phi_1(t) - \phi_3(t)]$$

$$V_{12}(t) \approx [\phi_1(t) - \phi_2(t)]$$

$$V_{13}(t) \approx [\phi_2(t) - \phi_3(t)]$$

Since three independent signal sources 14, 15, 20 are provided, it is also reasonable to assume that the noise content for each source 14, 15, 20 is uncorrelated and that the three baseband composite noise signals are uncorrelated. In addition, it is assumed that the three sources 14, 15, 20 produce ergotic random sequences. That is, the statistics of these random sequences may be determined from a single collation of observations. If this is role, time averaging may be substituted for ensemble averaging. Therefore, the auto correlation functions for the three composite signals may be computed at follows. The following equations are implemented in the autocorrelation generator routine 45 of FIG. 2.

$$R_{13}(t) = \lim_{T \to \infty} \frac{1}{T} \int_0^T V_{13}(v) \times V_{13}(v + t) dv$$

$$R_{12}(t) = \lim_{T \to \infty} \frac{1}{T} \int_0^T V_{12}(v) \times V_{12}(v + t) dv$$

$$R_{23}(t) = \lim_{T \to \infty} \frac{1}{T} \int_0^T V_{23}(v) \times V_{23}(v + t) dv$$

Expanding one of the three autocorrelation funcitons reveals the following:

$$R_{13}(t) =$$

$$\lim_{T \to \infty} \frac{1}{T} \int_0^T [\phi_1(v) - \phi_3(v)][\phi_1(v + t) - \phi_3(v + t)] dv$$

$$R_{13}(t) =$$

$$\lim_{T \to \infty} \frac{1}{T} \int_0^T [\phi_1(v)\phi_1(v + t)] - [\phi_1(v)\phi_3(v + t)] -$$

$$[\phi_1(v + t)\phi_3(v)] + [\phi_3(v)\phi_3(v + t)] dv$$

$$R_{13}(t) = r_1(t) - r_{13}(t) - r_{31}(t) + r_3(t),$$

where $r_1$, $r_3$ are autocorrelation functions and $r_{13}$, $r_{31}$ are cross correlation functions.

However, the phase noise of the three signals are assumed to be independent. Therefore, all cross correlation functions approach zero and the autocorrelation function simplifies to:

$$R_{13}(t) = r_1(t) + r_3(t).$$

Extrapolating these results, the autocorrelation functions of the remaining composite signals are computed in a similar manner.

$$R_{12}(t) = r_1(t) + r_2(t), \text{ and } R_{23}(t) = r_2(t) + r_3(t).$$

The last three equations represent the autocorrelation functions computed by the autocorrelation generator routine 45.

The averaging routine 46 sums a plurality of sets of autocorrelation signals and divides the resultant sum by the number of summed sets to produce an average value for the respective autorrelation functions. This averages out fluctuations in the signals.

Based on the Wiener-Khinchin Theorem, the Fourier transform of the autocorrelation function is representative of the power spectral density. The following equations are implemented in the Fourier transform routine 48 of FIG. 2.

$$F\{R_{13}(t)\} = |S_{13}(f)| \quad -\infty \leq f \leq \infty$$

$$F\{R_{12}(t)\} = |S_{12}(f)| \quad -\infty \leq f \leq \infty$$

$$F\{R_{23}(t)\} = |S_{23}(f)| \quad -\infty \leq f \leq \infty$$

For this process, a user would be more interested in the power contained in a frequency interval from 0 to $+\infty$ and would not want to distinguish between positive and negative values of frequency. Therefore, a one sided power spectral density function may be defined as follows:

$$P_{13}(f) = |S_{13}(f)| + |S_{13}(-f)| \quad 0 \leq f \leq \infty$$

$$P_{12}(f) = |S_{12}(f)| + |S_{12}(-f)| \quad 0 \leq f \leq \infty$$

$$P_{23}(f) = |S_{23}(f)| + |S_{23}(-f)| \quad 0 \leq f \leq \infty.$$

From above, $$R_{13}(t) = r_1(t) + r_3(t).$$

and the Fourier transform of $R_{13}(t)$ may be represented as follows:

$$F\{R_{13}(t)\} = F\{r_1(t)\} + F\{r_3(t)\}, \text{ or}$$

$$|S_{13}(f)| = |S_1(f)| + |S_3(f)| \quad \infty \leq f \leq \infty.$$

Converting the double sided power spectral density to a single sided representation yields:

$$P_{13}(f) = P_1(f) + P_3(f) \quad 0 \leq f \leq \infty.$$

Therefore, extrapolating these results for all three power spectral densities results in the following equations:

$$P_{13}(f) = P_1(f) + P_3(f) \quad 0 \leq f \leq \infty$$

$$P_{12}(f) = P_1(f) + P_2(f) \quad 0 \leq f \leq \infty$$

$$P_{23}(f) = P_2(f) + P_3(f) \quad 0 \leq f \leq \infty.$$

With these three equations, it is possible to solve for the individual power spectral densities of the three sources 14, 15, 20 which are represented by $P_1(f)$, $P_2(f)$, and $P_3(f)$ as a function of the measured composite power spectral densities represented by $P_{13}(f)$, $P_{12}(f)$, and $P_{23}(f)$. This is implemented in the noise extraction routine 48.

$$P_1(f) = [P_{13}(f) + P_{12}(f) - P_{23}(f)]/2$$

$$P_2(f) = [P_{12}(f) + P_{23}(f) - P_{13}(f)]/2$$

$$P_3(f) = [P_{13}(f) + P_{23}(f) - P_{12}(f)]/2.$$

The mathematical description presented above is for a continuous systems case. However, to implement a real world instrument to perform this process requires discretization and complex digital signal processing. Therefore, it is important to validate the process for systems that are characterized by discrete data samples.

Let $\phi_1(n\Delta t)$, $\phi_2(n\Delta t)$, and $\phi_3(n\Delta t)$ represent the discretely sampled phase noise content of the three discrete signal sources 14, 15, 20. These signal sources 14, 15, 20 (and their noise content) were originally continuous signals that were mixed down to 0 Hz baseband and then digitized. The mixing process is the same as described above.

$$V_{13}(n\Delta t) = \sin[\phi_1(n\Delta t) - \phi_3(n\Delta t)] \quad 0 \leq n \leq N-1$$

$$V_{12}(n\Delta t) = \sin[\phi_1(n\Delta t) - \phi_2(n\Delta t)] \quad 0 \leq n \leq N-1$$

$$V_{23}(n\Delta t) = \sin[\phi_2(n\Delta t) - \phi_3(n\Delta t)] \quad 0 \leq n \leq N-1$$

The composite noise signals (i.e.,: $\phi_1(n\Delta t) - \phi_3(n\Delta t)$) represent very small angles ($<<.1$ radians). Therefore, the following simplification is made:

$$V_{13}(n\Delta t) \approx [\phi_1(n\Delta t) - \phi_3(n\Delta t)] \quad 0 \leq n \leq N-1$$

$$V_{12}(n\Delta t) \approx [\phi_1(n\Delta t) - \phi_2(n\Delta t)] \quad 0 \leq n \leq N-1$$

$$V_{23}(n\Delta t) \approx [\phi_2(n\Delta t) - \phi_3(n\Delta t)] \quad 0 \leq n \leq N-1$$

Since these are three independent signal sources 14, 15, 20, it is also reasonable to assume that their noise content are also uncorrelated. It is also assumed that the three sources 14, 15, 20 produce a discrete ergotic random sequence. Therefore, the discrete autocorrelation functions for the three composite signals may be computed as follows:

$$R_{13}(m\Delta t) = \frac{1}{N} \sum_{n=0}^{N-|m|-1} \phi_{13}(n\Delta t)\phi_{13}([n+m]\Delta t)$$
$$0 \leq m \leq N-1$$

$$R_{12}(m\Delta t) = \frac{1}{N} \sum_{n=0}^{N-|m|-1} \phi_{12}(n\Delta t)\phi_{12}([n+m]\Delta t)$$
$$0 \leq m \leq N-1$$

$$R_{23}(m\Delta t) = \frac{1}{N} \sum_{n=0}^{N-|m|-1} \phi_{23}(n\Delta t)\phi_{23}([n+m]\Delta t)$$
$$0 \leq m \leq N-1.$$

Expanding the discrete autocorrelation functions and evaluating them results in:

$$R_{13}(m\Delta t) =$$

$$\frac{1}{N} \sum_{n=0}^{N-|m|-1} [\phi_1(n\Delta t) - \phi_3(n\Delta t)][\phi_1([n+m]\Delta t) - \phi_3([n+m]\Delta t)]$$

$$R_{13}(m\Delta t) = \frac{1}{N} \sum_{n=0}^{N-|m|-1} [\phi_1(n\Delta t)\phi_1([n+m]\Delta t) +$$

$$\phi_3(n\Delta t)\phi_3([n+m]\Delta t) - \phi_3(n\Delta t)\phi_1([n+m]\Delta t) -$$

$$\phi_1(n\Delta t)\phi_3([n+m]\Delta t).$$

If the signals $\phi_1(n\Delta t)$, $\phi_2(n\Delta t)$, and $\phi_3(n\Delta t)$ are independent and uncorrelated, then their discrete cross-correlation functions should approach zero. Therefore:

$$R_{13}(m\Delta t) = r_1(m\Delta t) + r_3(m\Delta t)$$

$$R_{23}(m\Delta t) = r_2(m\Delta t) + r_3(m\Delta t)$$

$$R_{12}(m\Delta t) = r_1(m\Delta t) + r_2(m\Delta t).$$

Based on the Wiener-Khinchin Theorem, the discrete Fourier transform of the discrete autocorrelation function is representative of the power spectral density.

$$F\{R_{13}(m\Delta t)\} = \frac{1}{N} \sum_{m=-N-1}^{N-1} R_{13}(m\Delta t)e^{-j\omega m} = |S_{13}(fm)|$$

$$F\{R_{12}(m\Delta t)\} = |S_{12}(fm)|$$

$$F\{R_{23}(m\Delta t)\} = |S_{23}(fm)|$$

and $$S_{13}(fm) = |S_1(fm)| + |S_3(fm)|$$

$$S_{12}(fm) = |S_1(fm)| + |S_2(fm)|$$

$$S_{23}(fm) = |S_2(fm)| + |S_3(fm)|.$$

However, it should also be noted that an alternative method for calculating discrete power spectral density functions is to use a periodogram method. The periodogram method is implemented by taking a discrete Fourier transform of the discrete time domain signal and then computing the power spectral density. This is performed in the fast Fourier transform routine 47.

$$V(fm) = \sum_{m=0}^{N-1} V(m\Delta t) e^{-j2\pi fm}$$

$$S(fm) = 1/N |V(fm)|^2.$$

The discrete power spectral density functions are then converted to a one-sided power spectrum in the same manner as described above.

$$P_{13}(fm) = |S(fm)| + |S(-fm)|, \text{ and therefore:}$$

$$P_{13}(fm) = P_1(fm) + P_3(fm)$$

$$P_{12}(fm) = P_1(fm) + P_2(fm)$$

$$P_{23}(fm) = P_2(fm) + P_3(fm).$$

At this point, there are three equations in three unknowns and all of the individual power spectral densities can be solved for.

$$P_1(fm) = [P_{13}(fm) + P_{12}(fm) - P_{23}(fm)]/2$$

$$P_2(fm) = [P_{12}(fm) + P_{23}(fm) - P_{23}(fm)]/2$$

$$P_3(fm) = [P_{13}(fm) + P_{22}(fm) - P_{12}(fm)]/2.$$

Thus there has been described a new and improved phase noise measurement system that uses three independent signal sources to statistically derive the power spectral density of the phase noise content of each of them. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A phase noise measurement system comprising:
   a primary signal source for providing a first signal whose phase noise is to be measured;
   second and third signal sources for providing second and third signals that each have substantially the same frequency and a similar noise content as first signal provided by the primary signal source;
   mixing means for mixing each of the first, second, and third signals two at a time to generate three respective difference signals;
   servo means for processing the three difference signals to remove carrier signals and long term signal drift therefrom;
   waveform recorder means coupled to the mixing means for capturing the respective three difference signals;
   processing means coupled to the waveform recorder means for statistically analyzing the three difference signals to compute composite power spectral densities therefor, and for computing respective individual power spectral densities of the first, second and third signals from the composite power spectral densities, and hence determining the phase noise of the primary signal source.

2. The system of claim 1 wherein the mixing means comprises:
   a plurality of mixers;
   a plurality of signal splitters selectively coupled between the signal sources and first inputs of the respective mixers;
   a plurality of programmable phase shifters respectively coupled between a selected splitter and second inputs of selected mixers; and
   a plurality of filters coupled to respective outputs of the plurality of mixers.

3. The system of claim 2 wherein the waveform recorder means is comprised of three waveform recorder channels.

4. The system of claim 3 further comprising a plurality of phase locked loops.

5. A method of determining the phase noise of signals provided by a primary signal source comprising:
   providing a first signal from a primary signal source whose phase noise is to be measured;
   providing second and third signals from second and third signal sources that each have substantially the same frequency and a similar noise content as first signal provided by the primary signal source;
   mixing each of the first, second, and third signals two at a time to generate three respective difference signals;
   processing the three difference signals to remove residual carrier and drift therefrom;
   statistically analyzing the three difference signals to compute composite power spectral densities therefor; and
   computing respective individual power spectral densities of the first, second and third signals from the composite power spectral densities to determine the phase noise of the primary signal source.

6. The method of claim 5 wherein the step of processing the three difference signals to remove the residual carrier and drift therefrom comprises the step of:
   sweeping a plurality of phase shifters to remove the respective residual carrier and drift from the three difference signals.

* * * * *